United States Patent
Tapily

(10) Patent No.: US 11,804,376 B2
(45) Date of Patent: Oct. 31, 2023

(54) METHOD FOR MITIGATING LATERAL FILM GROWTH IN AREA SELECTIVE DEPOSITION

(71) Applicant: Tokyo Electron Limited, Tokyo (JP)

(72) Inventor: Kandabara N. Tapily, Mechanicville, NY (US)

(73) Assignee: Tokyo Electron Limited, Tokyo (JP)

(*) Notice: Subject to any disclaimer, the term of this patent is extended or adjusted under 35 U.S.C. 154(b) by 86 days.

(21) Appl. No.: 16/930,842

(22) Filed: Jul. 16, 2020

(65) Prior Publication Data
US 2021/0020444 A1 Jan. 21, 2021

Related U.S. Application Data

(60) Provisional application No. 62/875,882, filed on Jul. 18, 2019.

(51) Int. Cl.
*H01L 21/285* (2006.01)
*H01L 21/02* (2006.01)

(52) U.S. Cl.
CPC .... *H01L 21/28562* (2013.01); *H01L 21/0228* (2013.01); *H01L 21/02304* (2013.01)

(58) Field of Classification Search
CPC ........... H01L 21/82562; H01L 21/0228; H01L 21/02304
See application file for complete search history.

(56) References Cited

U.S. PATENT DOCUMENTS

| | | | |
|---|---|---|---|
| 6,100,195 A * | 8/2000 | Chan | H01L 21/76858 257/E21.591 |
| 6,541,863 B1 * | 4/2003 | Horstmann | H01L 21/76832 257/734 |
| 7,932,186 B2 * | 4/2011 | Chang | H01L 51/0003 438/758 |
| 2004/0224321 A1 * | 11/2004 | Nicolau | B01J 19/0046 435/6.19 |
| 2007/0287277 A1 | 12/2007 | Kolics et al. | |
| 2008/0012009 A1 * | 1/2008 | Hashizume | H01L 51/105 257/40 |
| 2015/0097288 A1 * | 4/2015 | Liou | H01L 21/76826 438/667 |
| 2017/0148640 A1 | 5/2017 | Wang et al. | |
| 2018/0218914 A1 | 8/2018 | Basu et al. | |
| 2018/0233350 A1 | 8/2018 | Tois et al. | |
| 2018/0277612 A1 * | 9/2018 | Kim | H01L 27/3211 |
| 2019/0164749 A1 | 5/2019 | Tapily | |

OTHER PUBLICATIONS

Korean Intellectual Property Office, International Search Report and Written Opinion for international application No. PCT/US2020/042305, dated Oct. 26, 2020, 11 pages.

* cited by examiner

*Primary Examiner* — Dale E Page
*Assistant Examiner* — Quovaunda Jefferson

(57) ABSTRACT

A substrate processing method for area selective deposition includes providing a substrate containing a first film, a second film, and a third film, forming a first blocking layer on the first film, forming a second blocking layer on the second film, where the second blocking layer is different from the first blocking layer, and selectively forming a material film on the third film. In one example, the first film contains a metal film, second film contains a metal-containing liner that surrounds the metal film, and the third film includes a dielectric film that surrounds the metal-containing liner.

24 Claims, 7 Drawing Sheets

METHOD FOR MITIGATING LATERAL FILM GROWTH IN AREA SELECTIVE DEPOSITION

CROSS-REFERENCE TO RELATED APPLICATIONS

This application is related to and claims priority to U.S. Provisional Patent Application Ser. No. 62/875,882 filed on Jul. 18, 2019, the entire contents of which are herein incorporated by reference.

FIELD OF THE INVENTION

The present invention relates to semiconductor processing, and more particularly, to methods for area selective film deposition using a plurality of blocking layers to reduce lateral film growth.

BACKGROUND OF THE INVENTION

As device size is getting smaller, the complexity in semiconductor device manufacturing is increasing. The cost to produce the semiconductor devices is also increasing and cost effective solutions and innovations are needed. As smaller transistors are manufactured, the critical dimension (CD) or resolution of patterned features is becoming more challenging to produce. Selective deposition of thin films is a key step in patterning in highly scaled technology nodes. New deposition methods for controlling lateral growth and reducing defect density of selectively deposited materials are required.

SUMMARY OF THE INVENTION

Embodiments of the invention provide methods for selective material film formation using a plurality of blocking layers.

According to one embodiment, a substrate processing method includes providing a substrate containing a first film, a second film, and a third film, forming a first blocking layer on the first film, forming a second blocking layer on the second film, where the second blocking layer is different from the first blocking layer, and selectively forming a material film on the third film.

According to another embodiment, the substrate processing method includes providing a substrate containing a metal film, a metal-containing liner surrounding the metal film, and a dielectric film surrounding the metal-containing liner, forming a first blocking layer containing a first self-assembled monolayer (SAM) on the metal film, forming a second blocking layer containing a second SAM on the metal-containing liner, where the first SAM is different from the second SAM, and selectively forming a material film on the dielectric film.

According to another embodiment, the substrate processing method includes providing a substrate containing a metal film, a metal-containing liner containing a metal compound and surrounding the metal film, and a dielectric film surrounding the metal-containing liner, forming a first blocking layer containing a first self-assembled monolayer (SAM) on the metal film, forming a second blocking layer containing a second SAM on the metal-containing liner, wherein the first SAM includes a thiol and the second SAM includes a phosphonate. The method further includes selectively forming a material film on the dielectric film by depositing the material film on the dielectric film, depositing material film nuclei on the metal film, the metal-containing liner, or both the metal film and the metal-containing liner film, and removing the material film nuclei by etching.

BRIEF DESCRIPTION OF THE DRAWINGS

A more complete appreciation of embodiments of the invention and many of the attendant advantages thereof will become readily apparent with reference to the following detailed description, particularly when considered in conjunction with the accompanying drawings, in which.

DETAILED DESCRIPTION OF SEVERAL EMBODIMENTS

Figure 1:
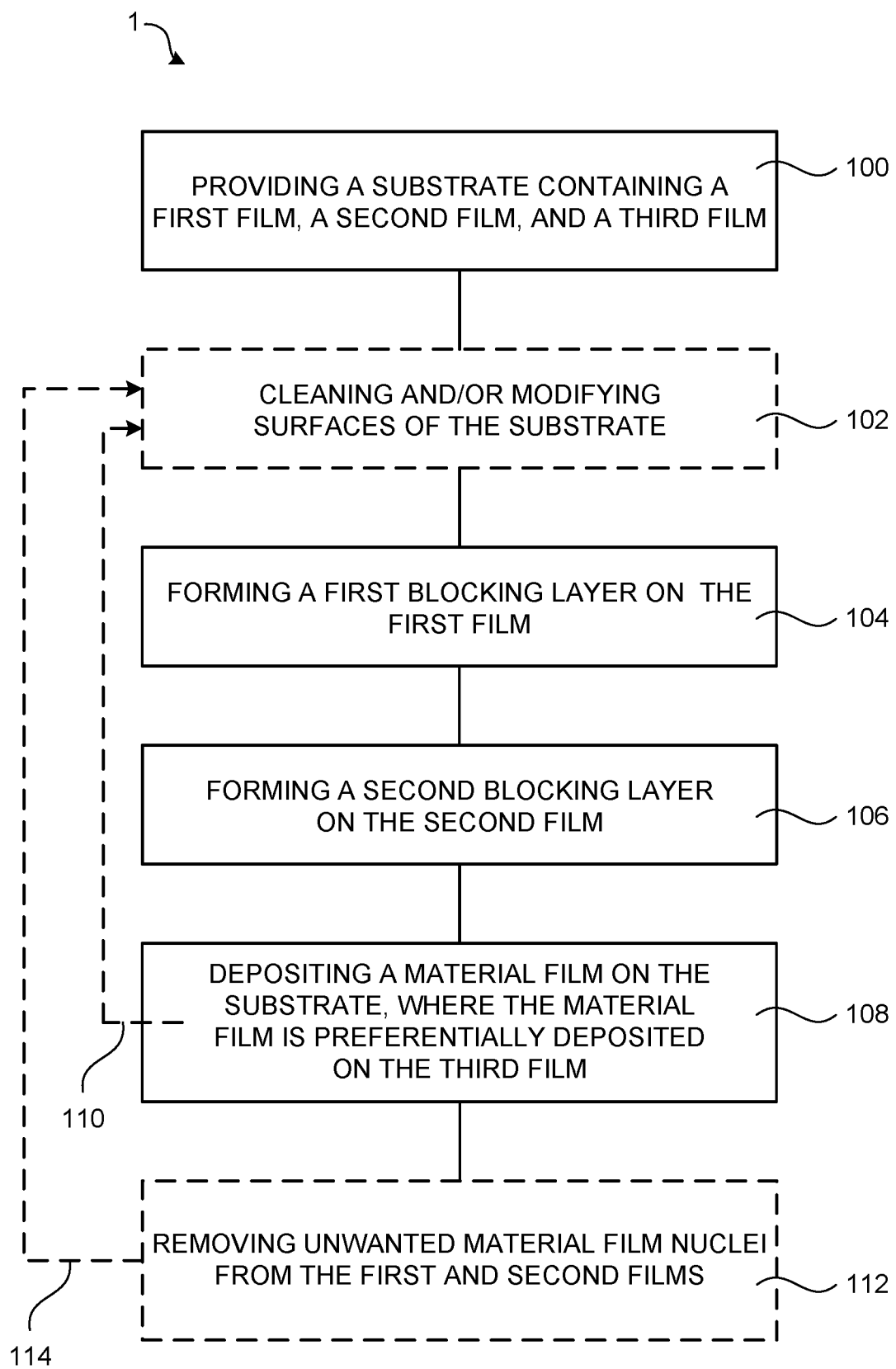
FIG. 1 is a process flow diagram for a method of selectively forming a material film on a substrate according to an embodiment of the invention.

Embodiments of the invention provide methods for selective formation of a material film on a surface of a semiconductor device using a plurality of blocking layers on the different substrate materials. Embodiments of the invention may be applied to area selective deposition (ASD) using surface sensitive deposition processes such as atomic layer deposition (ALD), chemical vapor deposition (CVD), and spin-on deposition. The method requires fewer processing steps when compared to conventional lithography and etching processes and can further provide an improved margin for line-to-line breakdown and electrical leakage performance in the semiconductor device.

Referring now to FIGS. 1 and 2A-2F, the process flow diagram 1 includes, in 100, providing substrate 2 containing a first film 200 having a first surface 200A, a second film 202 having a second surface 202A, and a third film 204 having a third surface 204A. In the example in FIG. 2A, the incoming planarized substrate 2 has the surfaces 200A, 202A, and 204A in the same horizontal plane. However, in other examples, one or more of the surfaces 200A, 202A, and 204A may be offset vertically. The first film 200, the second film 202, and the third film 204, can have different chemical compositions. In one example, one of those films includes a dielectric film, another film includes a metal-containing liner, and yet another film includes a metal film containing a pure or a substantially pure metal. The dielectric film can, for example, contain $SiO_2$, $Al_2O_3$, $HfO_2$, $TiO_2$, $ZrO_2$, SiN, SiCN, SiCOH, or a combination thereof. In one example, the dielectric film is a low-k material (k<4) that does not contain a metal element. The metal-containing liner can, for example, contain a metal compound such as a metal nitride (e.g., TiN or TaN) or a metal oxide (e.g., $MnO_2$ or $Al_2O_3$), or graphene, or a second metal film (e.g., Co or Ru) that is different from the metal film. The metal film can, for example, contain Cu, Al, Ta, Ti, W, Ru, Co, Ni, Pt, or Mo.

In 102, the surfaces 200A, 202A, and 204A for the substrate 2 are optionally cleaned, modified, or both cleaned and modified, in preparation for ASD on one or more of the films 200, 202, and 204. A planarization process used for forming the exemplary planarized substrate 2 can include a chemical mechanical polishing (CMP) process that uses a rotating polishing pad and a chemical slurry. The CMP process can leave polishing residue and oxidized material on the planarized substrate 2, and a surface cleaning process may be used for removing those contaminants. The surface cleaning process can also provide the desired surface termination for further processing or a separate surface modification process may be performed to achieve the desired surface termination. The surface cleaning process can include exposing the substrate 2 to a liquid containing an acid (e.g., citric acid or acetic acid) or to a gas phase plasma (e.g., plasma-excited $H_2$ gas).

Figure 2A:
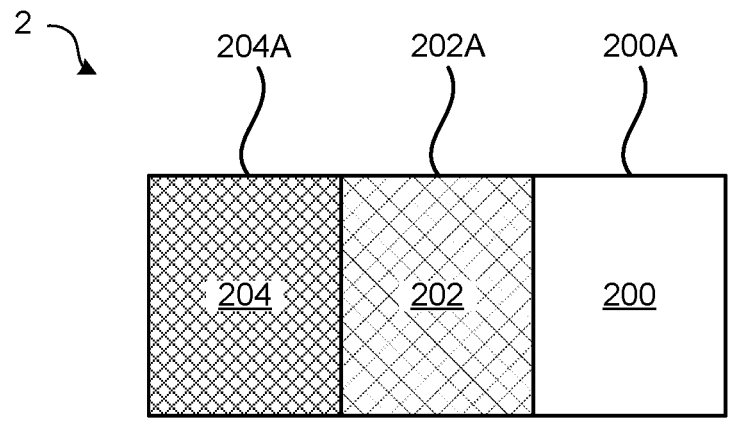
FIGS. 2A-2F show schematic cross-sectional views of a method of selectively forming a material film on a substrate according to an embodiment of the invention.
Figure 2B:
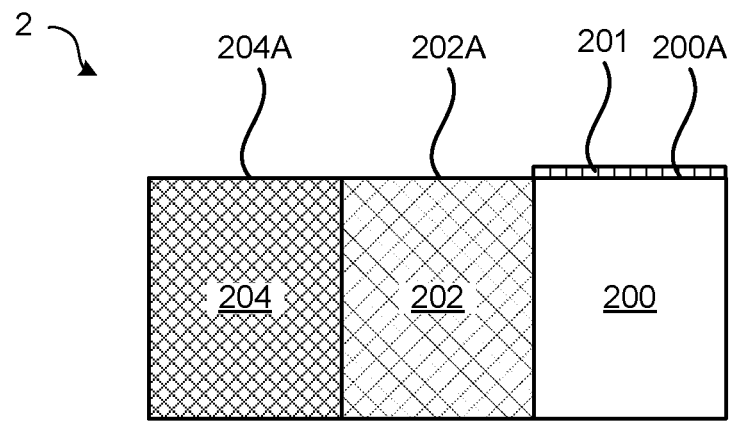
Figure 2C:
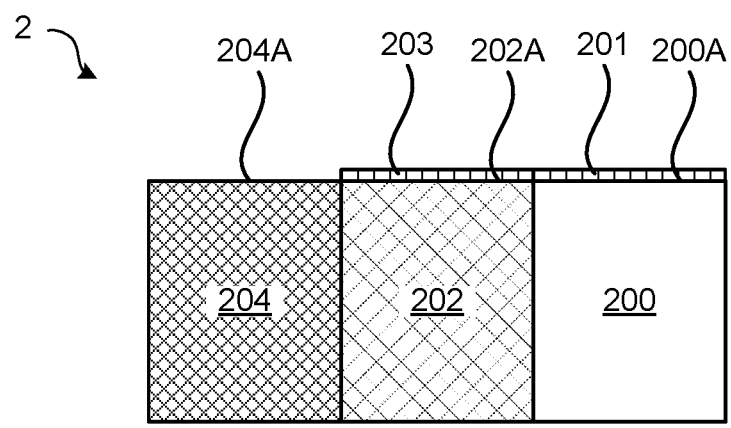

In 104, the method includes forming a first blocking layer 201 on the first film 200. This is schematically shown in FIG. 2B. The first blocking layer 201 can physically prevent or reduce subsequent deposition of a material film on the first film 200. According to one embodiment, the first blocking layer 201 includes a self-assembled monolayer (SAM) that is selectively formed on the first film 200 relative to the second film 202 and the third film 204. The first blocking layer 201 can be formed by exposing the substrate 2 to a reactant gas that contains a molecule that is capable of selectively forming the SAM. SAMs are molecular assemblies that are spontaneously formed on substrate surfaces by adsorption and are organized into more or less large ordered domains. A SAM can include a molecule that possesses a head group, a tail group, and a functional end group. A SAM is created by the chemisorption of head groups onto the substrate surface from the vapor phase at room temperature or above room temperature, followed by a slow organization of the tail groups. Initially, at small molecular density on the surface, adsorbate molecules form either a disordered mass of molecules or form an ordered two-dimensional "lying down phase", and at higher molecular coverage, over a period of minutes to hours, begin to form three-dimensional crystalline or semicrystalline structures on the substrate surface. The head groups assemble together on the substrate, while the tail groups assemble far from the substrate.

The head group of the molecule forming the SAM may be selected in view of the ability of the molecule to chemically bond to the different chemical species on different surfaces. Examples of SAM molecules include thiols, silanes, carboxylates, and phosphonates. For example, a thiol may be used to form a SAM on a metal film, a silane may be used to form a SAM on a dielectric film, and a phosphonate may be used to form a SAM on a metal-containing liner. A carboxylic acid can be tailored for either a metal film or an oxide dielectric film. Examples of silanes include molecules that contain C, H, Cl, F, and Si atoms, or C, H, Cl, and Si atoms. Non-limiting examples of silanes include perfluorodecyltrichlorosilane ($CF_3(CF_2)_7CH_2CH_2SiCl_3$), chlorodecyldimethylsilane ($CH_3(CH_2)_8CH_2Si(CH_3)_2Cl$), octadecyltrichlorosilane ($CH_3(CH_2)_{17}SiCl_3$), and tertbutyl(chloro)dimethylsilane (($CH_3)_3CSi(CH_3)_2Cl$)). Non-limiting examples of thiols include 1-octadecylthiol ($CH_3(CH_2)_{16}CH_2SH$), 1-dodecylthiol ($CH_3(CH_2)_{10}CH_2SH$), and 1H,1H,2H,2H-Perfluoro-1-decanethiol ($CF_3(CF_2)_7CH_2CH_2SH$). Non-limiting examples of phosphonic acids include octadecyl phosphonic acid ($C_{18}H_{39}O_3P$) and decyl phosphonic acid ($C_{10}H_{23}O_3P$). A non-limiting example of a carboxylic acid is decanoic acid ($C_{10}H_{20}O_2$).

In 106, the method further includes forming a second blocking layer 203 on the second film 202. This is schematically show in FIG. 2C. The second blocking layer 203 can include a SAM that is chemically different from the first blocking layer 201. In one example, the second blocking layer 203 can densify the first blocking layer 201. In another embodiment, the second blocking layer 203 may be formed on the substrate 2 before forming the first blocking layer 201. In yet another embodiment, the formation of the first blocking layer 201 and the second blocking layer 203 may overlap in time, for example by exposing the substrate 2 to a reactant gas containing two different SAM molecules.

Figure 2D:
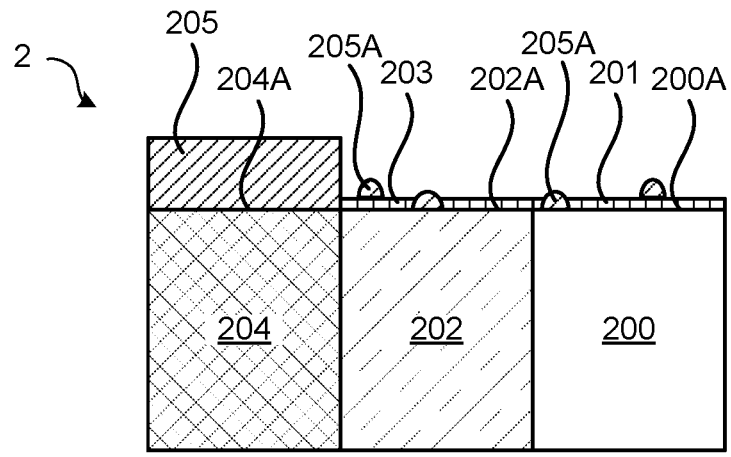

In 108, the method further includes depositing a material film 205 on the substrate 2, where the material film 205 is preferentially deposited on the third film 204 relative to the second film 202 and the first film 200, due to the blocking effects of the first blocking layer 201 on the first film 200 and the second blocking layer 203 on the second film 202. As depicted in FIG. 2D, the deposition of the material film 205 may not be completely selective to the third film 204 due to incomplete blocking of the first and second blocking layers 201 and 203, and unwanted deposition of material film nuclei 205A on the first film 200 and on the second film 202 can occur. The material film nuclei 205A have the same or similar chemical composition as the material film 205. In another example, the material film nuclei 205A may form a thin complete layer on the first film 200, the second film 202, or both, where the thin complete layer is thinner than the material film 205 on the third film 204.

In some examples, the material film 205 can include $SiO_2$, a metal, a metal oxide, or a metal nitride. The metal can include a pure or substantially pure metal selected from Cu, Al, Ta, Ti, W, Ru, Co, Ni, Pt, or Mo, for example. The metal oxide can, for example, include $HfO_2$, $ZrO_2$, or $Al_2O_3$. The metal nitride can, for example, include HfN, ZrN, or AlN. For example, the metal oxide film may be deposited by ALD or plasma-enhanced ALD (PEALD) using alternating exposures of a metal-containing precursor and an oxidizer (e.g., $H_2O$, $H_2O_2$, plasma-excited $O_2$, or $O_3$), and the metal nitride film may be deposited by ALD or PEALD using alternating exposures of a metal-containing precursor and an nitrogen-containing gas (e.g., $NH_3$, $N_2H_4$, or plasma-excited $N_2$)

According to one embodiment, as shown by the process arrow 110, steps 102-108 may be repeated at least once to increase a thickness of the material film 205 on the third film 204. When step 102 is repeated, the first and second blocking layers 201 and 203 may be removed, and then re-formed in steps 104 and 106.

Figure 2E:
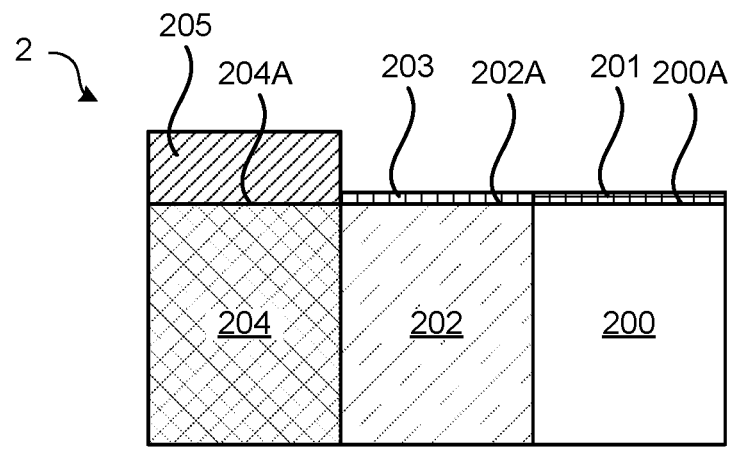

In 112, the method further includes optionally removing unwanted material film nuclei 205A from the first film 200 and the second film 202. This is schematically shown in FIG. 2E. The etching process can include a dry etching process, a wet etching process, or a combination thereof. In one example, the etching process may include an atomic layer etching (ALE) process. In some examples, the material film nuclei 205A may be removed using gas exposures of an etching gas, for example using $Al(CH_3)$, $BCl_3$, $TiCl_4$, or $SiCl_4$.

According to one embodiment, shown by the process arrow 114, steps 102-108 and 112 may be repeated at least once to increase a thickness of the material film 205 that is selectively formed on the third film 204.

Figure 2F:
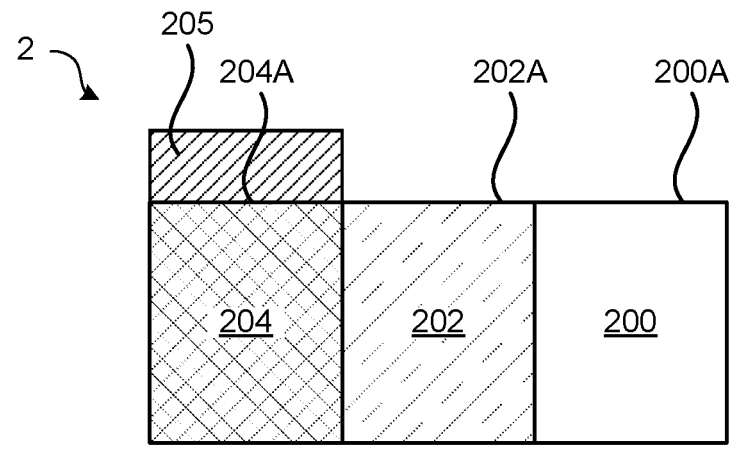
Figure 3:
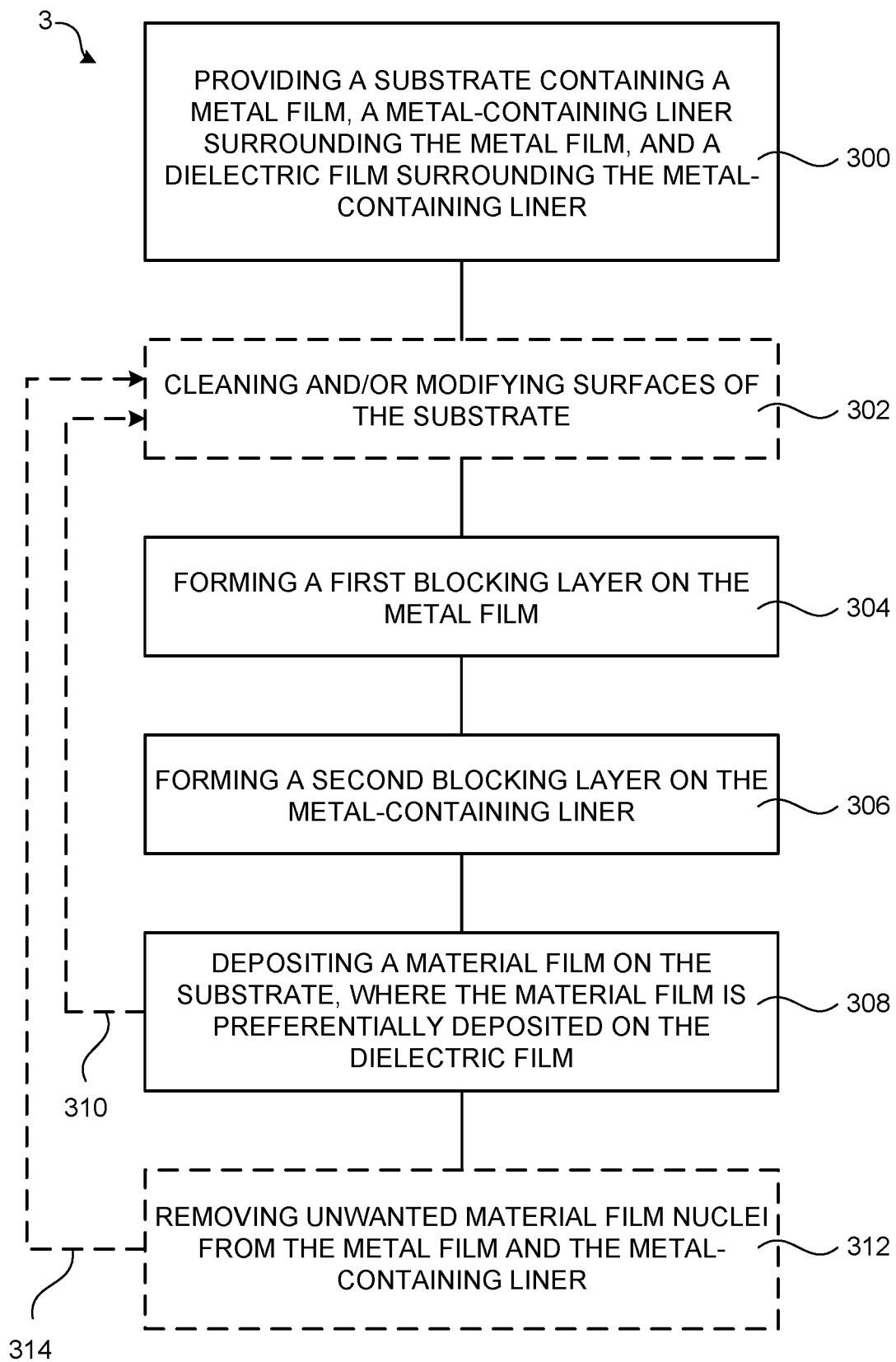
FIG. 3 is a process flow diagram for a method of selectively forming a material film on a substrate according to an embodiment of the invention.

In one example, the removal of the material film nuclei 205 in step 112 may also result in removal of the first and second blocking layers 201 and 203 from the substrate 2. In another example, when the desired thickness of the material film 205 has been reached, the first and second blocking layers 201 and 203 be removed by heating, for example. The resulting substrate 2 is schematically shown in FIG. 2F.

Referring now to FIGS. 3 and 4A-4D, the process flow diagram 3 includes, in 300, providing substrate 4 containing a metal film 400 having a first surface 400A, a metal-containing liner 402 surrounding the metal film 400 and having a second surface 402A, and a dielectric film 404 surrounding the metal-containing liner 402 and having a third surface 404A. This film structure and other similar film structures are commonly found in integrated circuits where the metal-containing liner 402 acts as a diffusion barrier between the metal film 400 and the dielectric film 404. The dielectric film 404 can, for example, contain $SiO_2$, $Al_2O_3$, $HfO_2$, $TiO_2$, $ZrO_2$, SiN, SiCN, SiCOH, or a combination thereof. In one example, the dielectric film 404 is a low-k material (k<4) that does not contain a metal element. The metal-containing liner 402 can, for example, contain a metal compound such as a metal nitride (e.g., TiN or TaN) or a metal oxide (e.g., $MnO_2$ or $Al_2O_3$), or graphene, or a second metal film (e.g., Co or Ru) that is different from the metal film 404. The metal film 404 can, for example, contain a pure or a substantially pure metal that includes Cu, Al, Ta, Ti, W, Ru, Co, Ni, Pt, or Mo.

In 302, the surfaces 400A, 402A, and 404A are optionally cleaned, modified, or both cleaned and modified, in preparation for area selective deposition of a material film on the dielectric film 404. The surface cleaning process may, for example, include exposing the substrate 4 to a liquid containing an acid (e.g., citric acid or acetic acid) or to a gas phase plasma (e.g., plasma-excited $H_2$ gas).

In 304, the method includes forming a first blocking layer 401 on the metal film 400. This is schematically show in FIG. 4B. The first blocking layer 201 can physically prevent or reduce subsequent deposition of a material film on the metal film 400. According to one embodiment, the first blocking layer 401 includes a SAM that is selectively formed on the metal film 400 relative to the metal-containing liner 402 and the dielectric film 404. The first blocking layer 401 may be formed by exposing the substrate 4 to a reactant gas containing a thiol that is capable of selectively forming the SAM on the metal film 400. Non-limiting examples of thiols include 1-octadecylthiol ($CH_3(CH_2)_{16}CH_2SH$), 1-dodecylthiol ($CH_3(CH_2)_{10}CH_2SH$), and 1H,1H,2H,2H-Perfluoro-1-decanethiol ($CF_3(CF_2)_7CH_2CH_2SH$).

In 306, the method further includes forming a second blocking layer 403 on the metal-containing liner 402. This is schematically show in FIG. 4C. The second blocking layer 403 is chemically different from the first blocking layer 401. According to one embodiment, a reactant gas containing a phosphonate head group may be used to selectively form the blocking layer 403 containing a SAM on the second surface 402A of the metal-containing liner 402. Non-limiting examples of phosphonic acids include octadecyl phosphonic acid ($C_{18}H_{39}O_3P$) and decyl phosphonic acid ($C_{10}H_{23}O_3P$). A non-limiting example of a carboxylic acid includes decanoic acid ($C_{10}H_{20}O_2$).

In another embodiment, the second blocking layer 403 may be formed on metal-containing liner 402 before forming the first blocking layer 401 on the metal film 400. In yet another embodiment, the formation of the first blocking layer 401 and the second blocking layer 403 may overlap in time, for example by exposing the substrate 4 to a reactant gas containing two different SAM molecules.

Figure 4A:
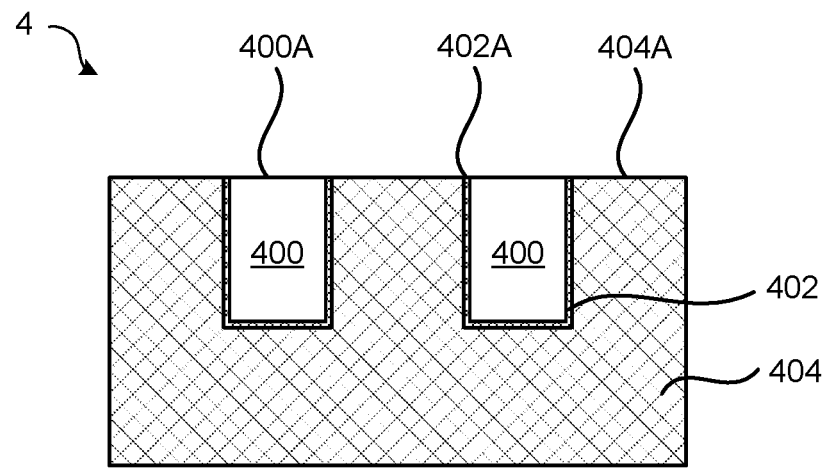
FIGS. 4A-4F show schematic cross-sectional views of a method of selectively forming a material film on a substrate according to an embodiment of the invention.
Figure 4B:
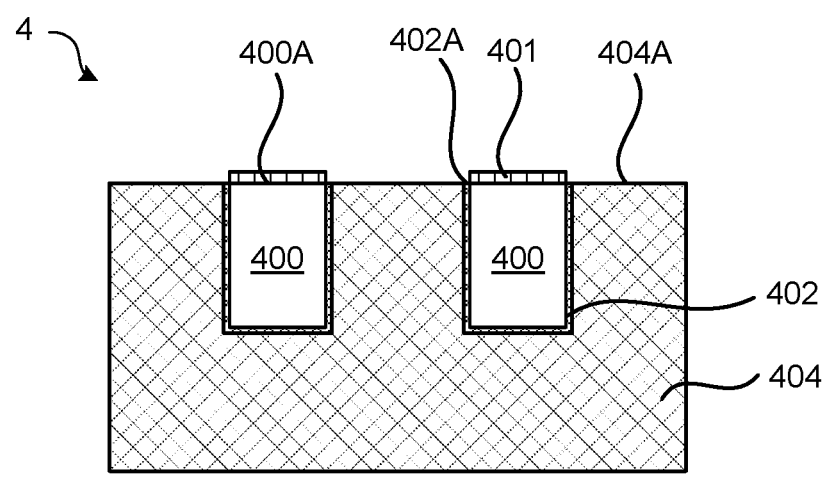
Figure 4C:
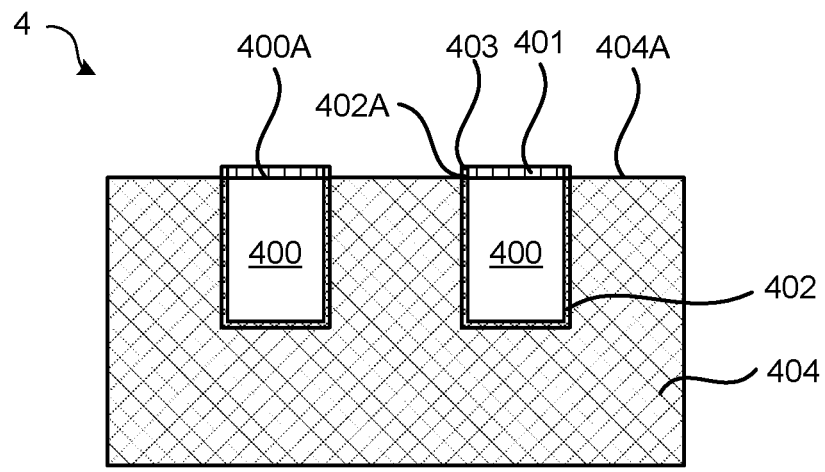
Figure 4D:
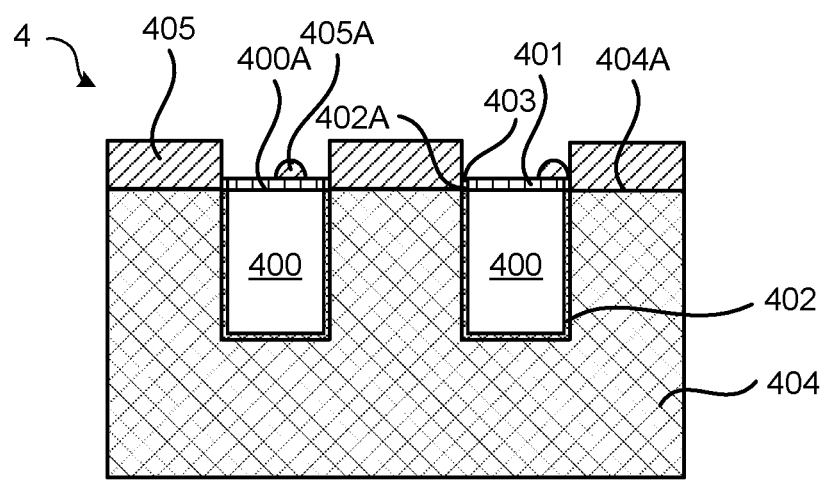

In 308, the method further includes depositing a material film 405 on the substrate 4, where the material film 405 is preferentially deposited on the dielectric film 404 relative to the metal-containing liner 402 and the metal film 400, due to the blocking of the first blocking layer 401 on the metal film 400 and the second blocking layer 403 on the metal-containing liner 402. As depicted in FIG. 4D, the deposition of the material film 405 may not be completely selective to the dielectric film 404 due to incomplete blocking of the first and second blocking layers 401 and 403, and unwanted deposition of material film nuclei 405A on the metal film 400 and on the metal-containing liner 402 may occur.

In some examples, the material film 405 can include $SiO_2$, a metal oxide, or a metal nitride. The metal oxide can, for example, include $HfO_2$, $ZrO_2$, or $Al_2O_3$. The metal nitride can, for example, include HfN, ZrN, or AlN. For example, the metal oxide film may be deposited by ALD or PEALD using alternating exposures of a metal-containing precursor and an oxidizer (e.g., $H_2O$, $H_2O_2$, or plasma-excited $O_2$ or $O_3$), and the metal nitride film may be deposited by ALD or PEALD using alternating exposures of a metal-containing precursor and an nitrogen-containing gas (e.g., $NH_3$, $N_2H_4$, or plasma-excited $N_2$).

According to one embodiment, as shown by the process arrow 310, steps 302-308 may be repeated at least once to increase a thickness of the material film 405 on the dielectric film 404. When step 302 is repeated, the first and second blocking layers 401 and 403 may be removed, and then re-formed in steps 304 and 306.

Figure 4E:
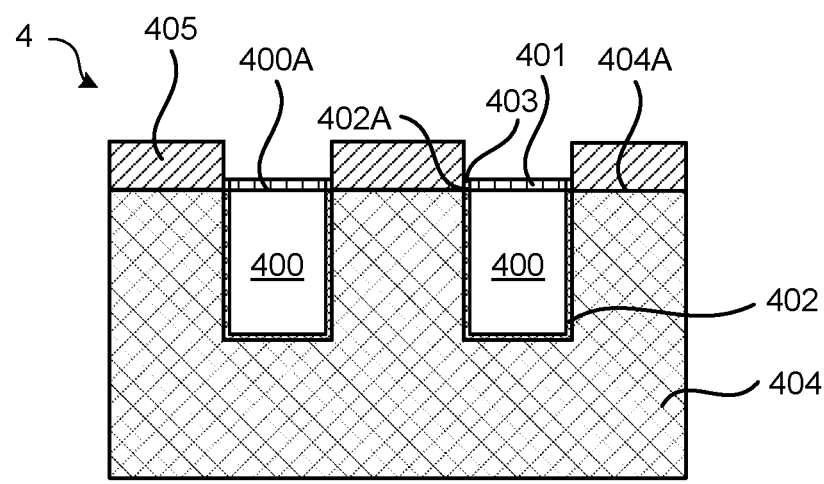

In 312, the method further includes optionally removing unwanted material film nuclei 405A from the metal film 400 and the metal-containing liner 402. This is schematically shown in FIG. 4E. The etching process can include a dry etching process, a wet etching process, or a combination thereof. In one example, the etching process may include an ALE process. In some examples, the material film nuclei 405A may be removed using gas exposures of an etching gas, for example using $Al(CH_3)$, $BCl_3$, $TiCl_4$, or $SiCl_4$.

According to one embodiment, shown by the process arrow 314, steps 302-308 and 312 may be repeated at least once to increase a thickness of the material film 405 that is selectively formed on the dielectric film 404.

Figure 4F:
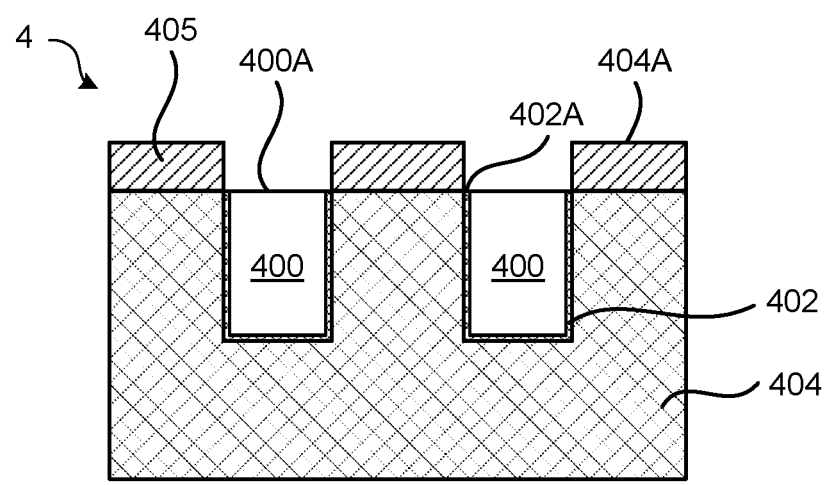

In one example, the removal of the material film nuclei 405 in step 312 may also result in removal of the first and second blocking layers 401 and 403 from the substrate. In another example, when the desired thickness of the material film 405 has been reached, the first and second blocking layers 401 and 403 be removed by heating, for example. The resulting substrate 4 is schematically shown in FIG. 4F. In one example, film structure in FIG. 4F can include a self-aligned via formed above the metal film 400 and the metal-containing liner 402 by the material film 405.

Methods for area selective film formation using a plurality of blocking layers have been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:
1. A substrate processing method, comprising:
    providing a substrate containing a first film, a second film, and a third film, wherein the first film, the second film, and the third film have different chemical compositions and are uncovered at the same time;
    forming a first blocking layer on the first film;

forming a second blocking layer on the second film, wherein the second blocking layer is different from the first blocking layer, and wherein the first blocking layer and the second blocking layer contain self-assembled monolayers (SAMs); and selectively forming a material film on the third film.

2. The method of claim 1, wherein the first film, the second film, and the third film are selected from the group consisting of a metal film, a metal-containing liner, and a dielectric film.

3. The method of claim 2, wherein the metal-containing liner contains a metal compound or a second metal film that is different from the metal film.

4. The method of claim 3, wherein the metal compound includes TiN, TaN, $MnO_2$, or $Al_2O_3$, and the second metal film includes Co or Ru.

5. The method of claim 2, wherein the metal film includes Cu, Al, Ta, Ti, W, Ru, Co, Ni, Pt, or Mo.

6. The method of claim 2, wherein the dielectric film includes $SiO_2$, $Al_2O_3$, $HfO_2$, $TiO_2$, $ZrO_2$, SiN, SiCN, SiCOH, or a combination thereof.

7. The method of claim 1, wherein the SAMs include a thiol, a silane, a carboxylate or a phosphonate.

8. The method of claim 1, wherein the material film includes $SiO_2$, a metal, a metal oxide, or a metal nitride.

9. The method of claim 8, wherein the metal oxide contains $HfO_2$, $ZrO_2$, or $Al_2O_3$, and the metal nitride contains HfN, ZrN, or AlN.

10. A substrate processing method, comprising:
providing a substrate containing a first film, a second film, and a third film, wherein the first film, the second film, and the third film have different chemical compositions;
forming a first blocking layer on the first film;
forming a second blocking layer on the second film, wherein the second blocking layer is different from the first blocking layer; and
selectively forming a material film on the third film, wherein the selectively forming the material film on the third film includes:
depositing the material film on the third film;
depositing material film nuclei on the first film, the second film, or both the first film and the second film; and
removing the material film nuclei by etching.

11. The method of claim 10, wherein the first film, the second film, and the third film are selected from the group consisting of a metal film, a metal-containing liner, and a dielectric film.

12. The method of claim 10, wherein the material film includes $SiO_2$, a metal, a metal oxide, or a metal nitride.

13. A substrate processing method, comprising:
providing a substrate containing a metal film, a metal-containing liner surrounding the metal film, and a dielectric film surrounding the metal-containing liner;
forming a first blocking layer containing a first self-assembled monolayer (SAM) on the metal film;
forming a second blocking layer containing a second SAM on the metal-containing liner, wherein the second SAM is different from the first SAM; and
selectively forming a material film on the dielectric film.

14. The method of claim 13, wherein the metal-containing liner contains a metal compound or a second metal film that is different from the metal film.

15. The method of claim 14, wherein the metal compound includes TiN, TaN, $MnO_2$ or $Al_2O_3$, and the second metal film includes Co or Ru.

16. The method of claim 13, wherein the metal film includes Cu, Al, Ta, Ti, W, Ru, Co, Ni, Pt, or Mo.

17. The method of claim 13, wherein the dielectric film includes $SiO_2$, $Al_2O_3$, $HfO_2$, $TiO_2$, $ZrO_2$, SiN, SiCN, SiCOH, or a combination thereof.

18. The method of claim 13, wherein the first SAM includes a thiol and the second SAM includes a phosphonate.

19. The method of claim 13, wherein the material film includes $SiO_2$, a metal, a metal oxide, or a metal nitride.

20. The method of claim 13, wherein the selectively forming the material film on the dielectric film includes:
depositing the material film on the dielectric film;
depositing material film nuclei on the metal film, the metal-containing liner, or both the metal film and the metal-containing liner; and
removing the material film nuclei by etching.

21. A substrate processing method, comprising:
providing a substrate containing a metal film, a metal-containing liner containing a metal compound and surrounding the metal film, and a dielectric film surrounding the metal-containing liner;
forming a first blocking layer containing a first self-assembled monolayer (SAM) on the metal film;
forming a second blocking layer containing a second SAM on the metal-containing liner; and
selectively forming a material film on the dielectric film by:
depositing the material film on the dielectric film;
depositing material film nuclei on the metal film, the metal-containing liner, or both the metal film and the metal-containing liner; and
removing the material film nuclei by etching.

22. The method of claim 21, wherein the first SAM includes a thiol and the second SAM includes a phosphonate.

23. The method of claim 21, wherein the second SAM includes a phosphonate or a carboxylate.

24. The method of claim 21, wherein forming the second SAM densifies the first SAM.

* * * * *